US009002309B2

(12) United States Patent
Sahota et al.

(10) Patent No.: US 9,002,309 B2
(45) Date of Patent: Apr. 7, 2015

(54) TUNABLE MULTI-BAND RECEIVER

(75) Inventors: Gurkanwal Singh Sahota, San Diego, CA (US); Steven C. Ciccarelli, San Deigo, CA (US); Sang-June Park, San Diego, CA (US); Charles J. Persico, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 307 days.

(21) Appl. No.: 13/118,283

(22) Filed: May 27, 2011

(65) Prior Publication Data

US 2012/0302188 A1    Nov. 29, 2012

(51) Int. Cl.
*H04B 1/18* (2006.01)
*H04B 1/00* (2006.01)
*H04B 1/10* (2006.01)
*H03H 7/01* (2006.01)

(52) U.S. Cl.
CPC ............... *H04B 1/525* (2013.01); *H04B 1/006* (2013.01); *H04B 1/1036* (2013.01); *H03H 2007/013* (2013.01)

(58) Field of Classification Search
USPC .............. 455/73, 78, 550.1, 552.1, 130, 132, 455/133, 135, 277, 277.2, 295, 307, 179.1, 455/180.1, 266, 277.1, 296
See application file for complete search history.

(56) References Cited

U.S. PATENT DOCUMENTS

| 2002/0175870 | A1 | 11/2002 | Gleener |
| 2005/0215204 | A1* | 9/2005 | Wallace et al. ............... 455/78 |
| 2005/0264466 | A1 | 12/2005 | Hibino et al. |
| 2006/0052131 | A1* | 3/2006 | Ichihara ................. 455/552.1 |
| 2006/0135071 | A1 | 6/2006 | Kim |
| 2007/0149146 | A1 | 6/2007 | Hwang et al. |
| 2007/0298838 | A1 | 12/2007 | Meiyappan et al. |
| 2008/0310480 | A1* | 12/2008 | Maiuzzo ...................... 375/133 |

FOREIGN PATENT DOCUMENTS

| CN | 1511357 A | 7/2004 |
| CN | 1917685 A | 2/2007 |

OTHER PUBLICATIONS

International Search Report and Written Opinion—PCT/US2012/039455—ISA/EPO—Aug. 28, 2012.

* cited by examiner

*Primary Examiner* — Thanh Le
(74) *Attorney, Agent, or Firm* — Ramin Mobarhan

(57) ABSTRACT

A tunable multi-band receiver supporting operation on a plurality of frequency bands is disclosed. In an exemplary design, the tunable multi-band receiver includes an antenna tuning network, a tunable notch filter, and at least one low noise amplifier (LNA). The antenna tuning network tunes an antenna (e.g., a diversity antenna) to a receive band in a plurality of receive bands. The tunable notch filter is tunable to a transmit band in a plurality of transmit bands and attenuates signal components in the transmit band. One LNA among the at least one LNA amplifies an output signal from the tunable notch filter. The tunable multi-band receiver may further include one or more additional tunable notch filters to further attenuate the signal components in the transmit band.

24 Claims, 10 Drawing Sheets

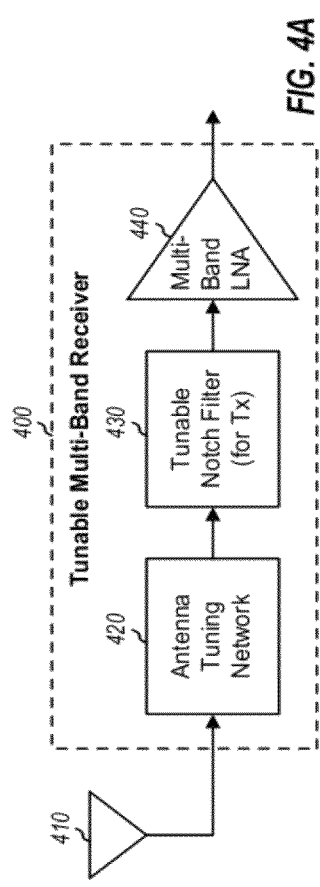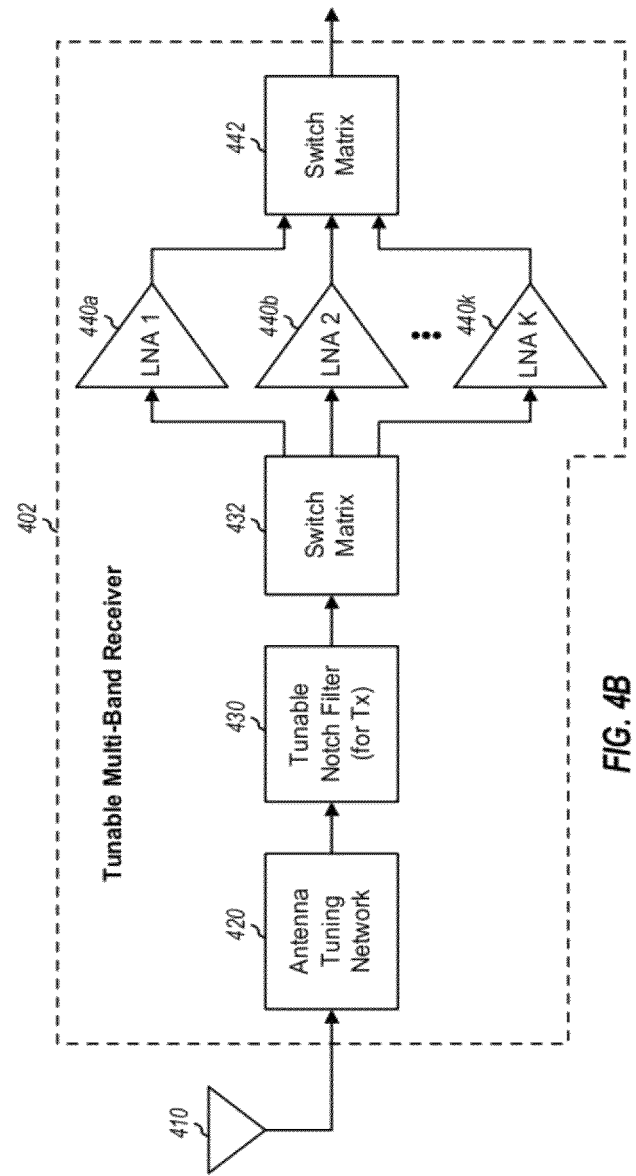

US 9,002,309 B2

TUNABLE MULTI-BAND RECEIVER

BACKGROUND

I. Field

The present disclosure relates generally to electronics, and more specifically to a receiver.

II. Background

A wireless communication device (e.g., a cellular phone) may include a transmitter and a receiver coupled to a primary antenna to support two-way communication. For data transmission, the transmitter may modulate a radio frequency (RF) carrier signal with data to obtain a modulated signal, amplify the modulated signal to obtain a transmit (TX) signal having the proper signal level, and transmit the TX signal via the primary antenna to a base station. For data reception, the receiver may obtain a receive (RX) signal via the primary antenna and may condition and process the RX signal to recover data sent by the base station.

The wireless device may include a diversity (DRX) receiver coupled to a diversity/secondary antenna. The diversity receiver may obtain a secondary RX signal via the diversity antenna and may condition and process the secondary RX signal to recover data sent by the base station. The diversity receiver may help mitigate multipath and fading and may also help to cancel interference from other systems on the same frequency. The diversity receiver may improve end user experience by increasing download speed and power and may also provide other advantages.

The wireless device may be capable of communicating with different wireless systems and/or may support operation on multiple frequency bands. These capabilities may allow the wireless device to receive communication services from more systems and enjoy greater coverage. The wireless device may have a number of receive paths in a receiver for all frequency bands and systems supported by the receiver. Each receive path may include a set of circuit blocks such as an RX filter, a low noise amplifier (LNA), etc. The circuit blocks for each receive path may be designed specifically for one or more frequency bands and/or one or more systems supported by that receive path. The wireless device may have many receive paths and many circuit blocks in order to support multiple frequency bands and/or multiple systems. These many receive paths may increase the complexity, size, cost and power consumption of the wireless device, all of which may be undesirable.

BRIEF DESCRIPTION OF THE DRAWINGS

FIGS. 4A and 4B show two exemplary designs of a tunable multi-band receiver.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Tunable multi-band receivers that may be used for any antenna (e.g., a diversity antenna) are described herein. These receivers may be used for various electronic devices such as wireless communication devices, cellular phones, personal digital assistants (PDAs), handheld devices, wireless modems, smart phones, laptop computers, smartbooks, netbooks, tablets, cordless phones, wireless local loop (WLL) stations, Bluetooth devices, consumer electronic devices, a broadcast receiver, etc. For clarity, the use of the tunable multi-band receivers for a wireless communication device is described below.

Figure 1:
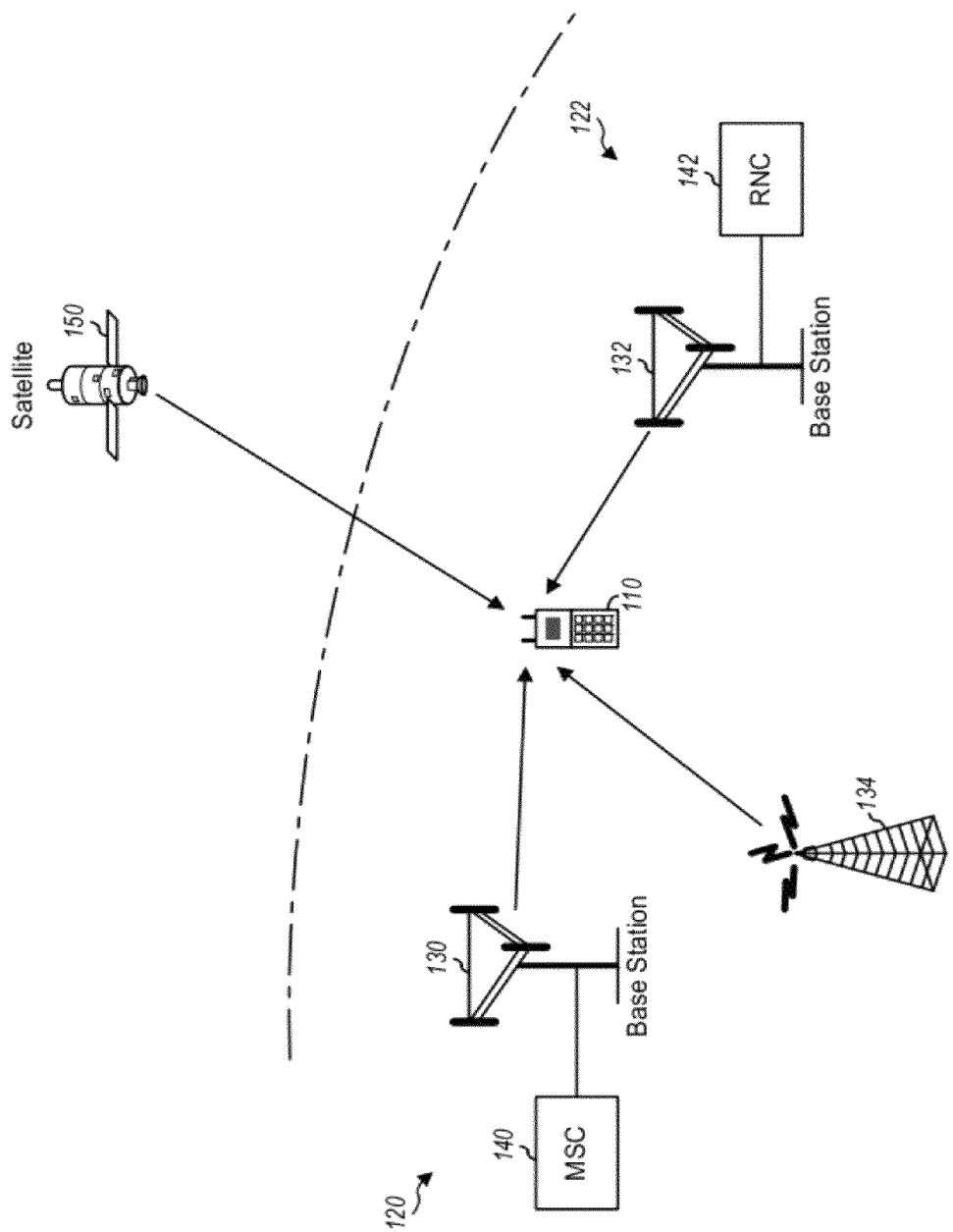
FIG. 1 shows a wireless device communicating with multiple wireless systems.

FIG. 1 shows a wireless communication device 110 capable of communicating with multiple wireless communication systems 120 and 122. Wireless system 120 may be a Code Division Multiple Access (CDMA) system, which may implement Wideband CDMA (WCDMA), cdma2000, or some other version of CDMA. Wireless system 122 may be a Global System for Mobile Communications (GSM) system, a Long Term Evolution (LTE) system, a wireless local area network (WLAN) system, etc. For simplicity, FIG. 1 shows wireless system 120 including one base station 130 and one mobile switching center (MSC) 140, and system 122 including one base station 132 and one radio network controller (RNC). In general, each system may include any number of base stations and any set of network entities.

Wireless device 110 may also be referred to as a user equipment (UE), a mobile station, a terminal, an access terminal, a subscriber unit, a station, etc. Wireless device 110 may be equipped with any number of antennas. In an exemplary design, wireless device 110 includes two antennas—a primary antenna and a diversity/secondary antenna. Multiple antennas may be used to provide diversity against deleterious path effects such as fading, multipath, interference, etc. Multiple antennas may also be used to support multiple-input multiple-output (MIMO) transmission to improve data rate and/or obtain other benefits. Wireless device 110 may be capable of communicating with wireless system 120 and/or 122. Wireless device 110 may also be capable of receiving signals from broadcast stations (e.g., a broadcast station 134). Wireless device 110 may also be capable of receiving signals from satellites (e.g., a satellite 150) in one or more global navigation satellite systems (GNSS).

In general, wireless device 110 may support communication with any number of wireless systems, which may employ any radio technologies such as WCDMA, cdma2000, GSM, LTE, GPS, etc. Wireless device 110 may also support operation on any number of frequency bands.

Figure 2:
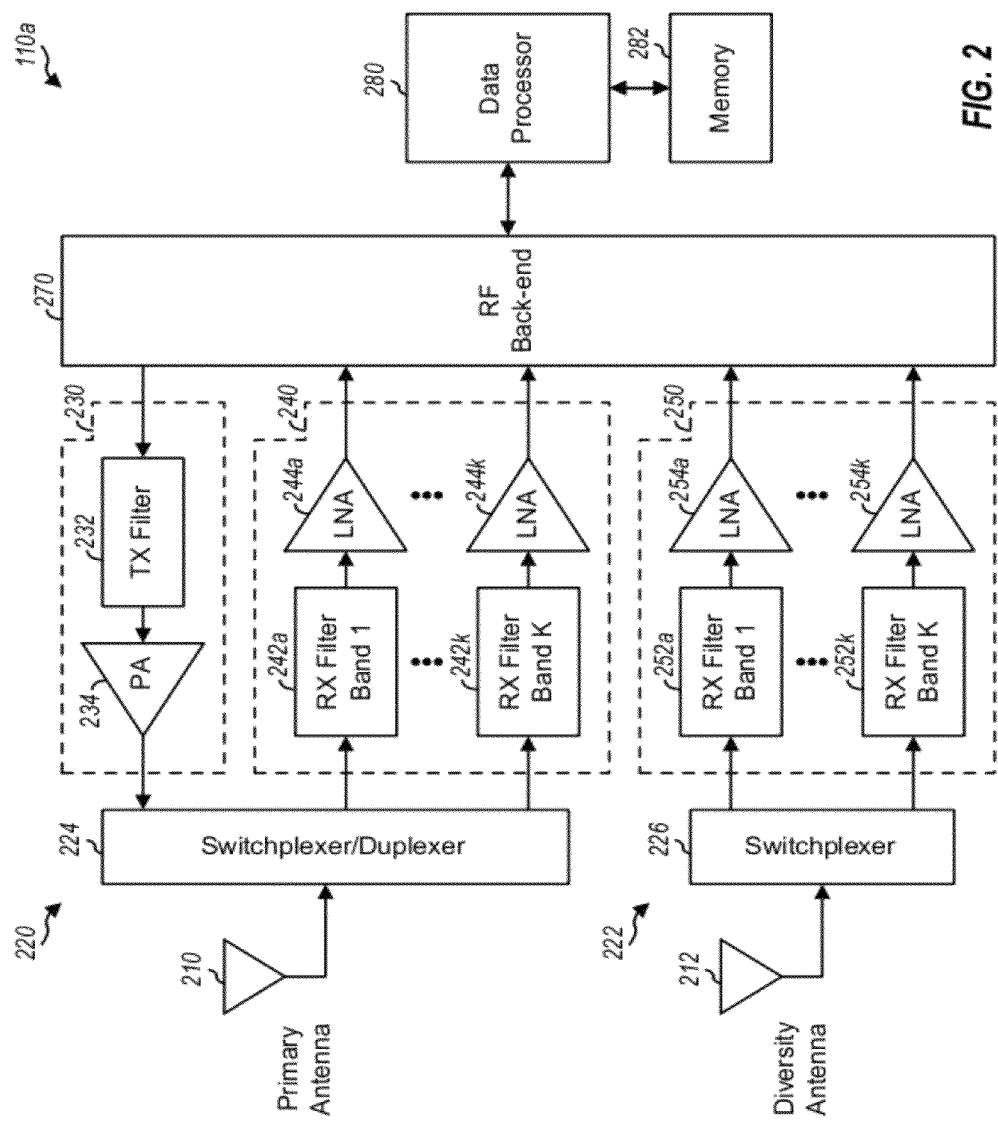
FIG. 2 shows a wireless device with multiple receive paths for each antenna.

FIG. 2 shows a block diagram of a wireless device 110a with multiple receive paths for each antenna. Wireless device 110a is an exemplary design of wireless device 110 in FIG. 1. Wireless device 110a includes a primary antenna 210 coupled to a primary section 220 and a diversity antenna 212 coupled to a diversity section 222. For simplicity, FIG. 2 shows primary section 220 including a transmit (TX) module 230 supporting data transmission on one or more frequency bands and a receive (RX) module 240 supporting data reception on multiple (K) frequency bands, where K may be any integer value. Diversity section 222 includes an RX module 250 supporting data reception on multiple (K) frequency bands. In general, RX modules 240 and 250 may support the same set of frequency bands (as assumed for much of the description below) or different sets of frequency bands.

Within primary section 220, a switchplexer/duplexer 224 performs switching and/or routing to (i) couple either TX module 230 or RX module 240 to primary antenna 210 and (ii) couple an appropriate receive path within RX module 240 to primary antenna 210 during data reception. Switchplexer/duplexer 224 has an antenna port coupled to primary antenna 210 and input/output (I/O) ports coupled to a transmit path within TX module 230 and K receive paths within RX module 240. Switchplexer 224 couples the antenna port to one of the I/O ports at any given moment.

TX module 230 includes a TX filter 232 and a power amplifier (PA) 234 for one transmit path. An output RF signal from an RF back-end 270 is filtered by TX filter 232 and amplified by power amplifier 234 to obtain a TX signal, which is routed through switchplexer/duplexer 224 and transmitted via primary antenna 210. TX module 230 may also include one or more additional transmit paths.

RX module 240 includes K receive paths, which may support different frequency bands and/or different wireless systems. For example, one receive path may be used for each frequency band of interest. Each receive path includes an RX filter 242 coupled to a LNA 244. RX filters 242a through 242k for K receive paths may filter their RX signals for different frequency bands and provide filtered signals to LNAs 244a through 244k, respectively. LNAs 244a through 244k may amplify their filtered signals and provide input RF signals to RF back-end 270. Switchplexer/duplexer 224 selects a frequency band of operation for primary section 220 and couples an RX signal from primary antenna 210 to the receive path for the selected frequency band.

Within diversity section 222, a switchplexer 226 has an antenna port coupled to diversity antenna 212 and K I/O ports coupled to K receive paths within RX module 250. The K receive paths may support different frequency bands and/or different wireless systems. Each receive path includes an RX filter 252 coupled to a LNA 254. RX filters 252a through 252k for the K receive paths may filter their RX signals for different frequency bands and provide filtered signals to LNAs 254a through 254k, respectively. LNAs 254a through 254k may amplify their filtered signals and provide input RF signals to RF back-end 270. Switchplexer 226 selects a frequency band of operation for diversity section 222 and couples an RX signal from diversity antenna 212 to the receive path for the selected frequency band.

RF back-end 270 may include various circuit blocks such as downconverters, upconverters, amplifiers, filters, buffers, etc. RF back-end 270 may frequency downconvert, amplify and filter an input RF signal from any of the LNAs and provide an input baseband signal to a data processor 280. RF back-end 270 may also amplify, filter and frequency upconvert an output baseband signal and provide an output RF signal to filter 232. All or a portion of modules 230, 240 and 250 and RF back-end 270 may be implemented on one or more analog integrated circuits (ICs), RF ICs (RFICs), mixed-signal ICs, etc.

Data processor 280 may perform various functions for wireless device 110a, e.g., processing for data being transmitted and received. A memory 282 may store program codes and data for data processor 280. Data processor 280 may be implemented on one or more application specific integrated circuits (ASICs) and/or other ICs.

Wireless device 110a may operate on a particular frequency band at any given moment. For frequency division duplexing (FDD), the particular frequency band may include a transmit band and a receive band. Wireless device 110a may simultaneously transmit a TX signal on the transmit band and receive a desired signal on the receive band.

At wireless device 110a, a portion of the TX signal from TX module 230 in primary section 220 may couple to RX module 240 within primary section 220 and also to RX module 250 in diversity section 222. The coupling may be via antennas 210 and 212 and/or routing traces. An RX signal from switchplexer/duplexer 224 to each RX filter 242 may include a desired signal in the receive band as well as a leaked TX signal in the transmit band. Similarly, an RX signal from switchplexer 226 to each RX filter 252 may include a desired signal in the receive band as well as a leaked TX signal in the transmit band. The TX signal may have a large amplitude (e.g., +23 dBm for CDMA or +33 dBm for GSM), especially when the wireless device is located far away from a base station. Hence, even though the coupling may be relatively small, the leaked TX signal may be large relative to the desired signal due to the large amplitude of the TX signal. RX filter 242 or 252 for each receive path may pass the desired signal in the receive band and attenuate the leaked TX signal in the transmit band so that as little of the leaked TX signal passes to LNA 244 or 254 in that receive path and good performance can be obtained.

In general, a receiver may include any number of RX filters for any number of frequency bands and any number of wireless systems. The RX filters may also be referred to as front-end RF filters and may typically be high quality factor (Q) filters. For example, the RX filters may be implemented with surface acoustic wave (SAW) filters, bulk acoustic wave (BAW) filters, or thin film bulk acoustic resonator (FBAR) filters, which typically cannot be integrated on an IC chip. One RX filter and one LNA may be used for each frequency band and may be designed specifically for that frequency band. The receiver may include many RX filters and many LNAs for all supported frequency bands. For example, the receiver may include five SAW filters and five LNAs to support five frequency bands. The use of multiple RX filters and multiple LNAs to support multiple frequency bands may increase cost, board area, and routing complexity for wireless device 110a.

In an aspect, a tunable multi-band receiver may be used to support multiple frequency bands without the need for an individual RX filter for each frequency band. The tunable multi-band receiver may include a single receive path for multiple frequency bands and may provide various advantages such as smaller size, lower cost, better reliability, etc.

Figure 3:
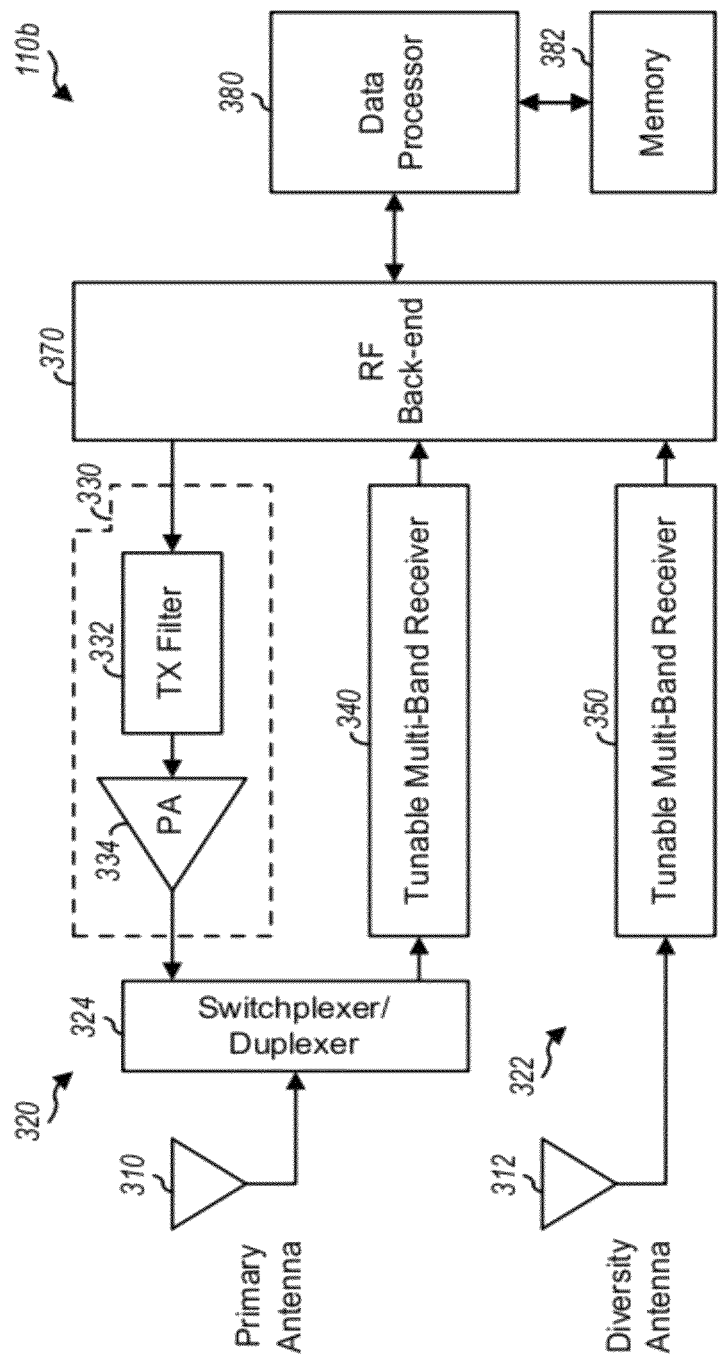
FIG. 3 shows a wireless device with tunable multi-band receivers.

FIG. 3 shows a block diagram of a wireless device 110b with tunable multi-band receivers. Wireless device 110b is another exemplary design of wireless device 110 in FIG. 1. Wireless device 110b includes a primary antenna 310 coupled to a primary section 320 and a diversity antenna 312 coupled to a diversity section 322. Primary section 320 including a TX module 330 supporting data transmission on one or more frequency bands and a tunable multi-band receiver 340 supporting data reception on multiple frequency bands. Diversity section 222 includes a tunable multi-band receiver 350 supporting data reception on multiple frequency bands. An RF back-end 370 may frequency downconvert, amplify, and filter an input RF signal from tunable multi-band receiver 340 or 350 and may provide an input baseband signal to a data processor 380. RF back-end 370 may also amplify, filter, and frequency upconvert an output baseband signal and may provide an output RF signal to TX module 330. All or a portion of TX module 330, tunable multi-band receivers 340 and 350, and RF back-end 370 may be implemented on one or more analog ICs, RFICs, mixed-signal ICs, etc. A data processor 380 may perform various functions for wireless device 110b. A memory 382 may store program codes and data for data processor 380.

FIG. 3 shows an exemplary design in which a tunable multi-band receiver is used for each of primary antenna 310 and diversity antenna 312. In another exemplary design, a tunable multi-band receiver may be used for only primary antenna 310 or only diversity antenna 312. In general, a tunable multi-band receiver may or may not be used for each antenna available on a wireless device. An RX module with multiple receive paths (e.g., RX module 240 or 250 in FIG. 2) may be used for each antenna for which a tunable multi-band receiver is not used.

FIG. 4A shows a block diagram of an exemplary design of a tunable multi-band receiver 400 coupled to an antenna 410. Tunable multi-band receiver 400 may be used for tunable multi-band receiver 340 in FIG. 3, and antenna 410 may correspond to primary antenna 310. Alternatively or additionally, tunable multi-band receiver 400 may be used for tunable multi-band receiver 350 in FIG. 3, and antenna 410 may correspond to diversity antenna 312.

In the exemplary design shown in FIG. 4A, tunable multi-band receiver 400 includes an antenna tuning network 420, a tunable notch filter 430, and a LNA 440 coupled in series. Antenna tuning network 420 may be coupled directly to antenna 410 (as shown in FIG. 4A) or indirectly to antenna 410 via one or more circuits such as switches. Antenna tuning network 420, tunable notch filter 430, and LNA 440 may support operation of multiple frequency bands.

FIG. 4B shows a block diagram of an exemplary design of a tunable multi-band receiver 402 coupled to antenna 410. Tunable multi-band receiver 402 may be used for tunable multi-band receiver 340 in FIG. 3, and antenna 410 may correspond to primary antenna 310. Alternatively or additionally, tunable multi-band receiver 402 may be used for tunable multi-band receiver 350 in FIG. 3, and antenna 410 may correspond to diversity antenna 312.

In the exemplary design shown in FIG. 4B, tunable multi-band receiver 402 includes antenna tuning network 420, tunable notch filter 430, a switch matrix 432, multiple (K) LNAs 440a through 440k, and a switch matrix 442 coupled in series. Antenna tuning network 420 may be coupled directly to antenna 410 (as shown in FIG. 4B) or indirectly to antenna 410 via one or more circuits such as switches. K LNAs 440a through 440k may have their inputs coupled to switch matrix 432 and their outputs coupled to switch matrix 442. Switch matrix 442 may have its output coupled to a subsequent circuit (e.g., a wideband downconverter).

In general, a tunable multi-band receiver may include any number of LNAs to support any number of frequency bands. Each LNA may support a single frequency band or multiple frequency bands. The number of LNAs may be dependent on the bandwidth of each LNA and the frequency bands being supported. For example, there may be one LNA for high band and another LNA for low band. If only one LNA is present (e.g., as shown in FIG. 4A), then this LNA may be coupled to tunable notch filter 430, and switch matrices may be omitted. If multiple LNAs are present (e.g., as shown in FIG. 4B), then one LNA 440 may be selected at any given moment via switch matrices 432 and 442.

Antenna 410 may be an electrically small antenna or a normal antenna. If antenna 410 is a small antenna, then antenna 410 may have a narrow band due to its small size. Regardless of the size of antenna 410, antenna tuning network 420 allows antenna 410 to be tuned over a wider frequency range (e.g., from 440 MHz to 2.6 GHz). Antenna tuning network 420 may also provide selectivity once antenna 410 is tuned to a particular frequency band. Tunable notch filter 430 passes desired signal components in a receive band and attenuates leaked TX signal components in a transmit band, so that as little of a TX signal from a transmitter is coupled to the receive path of receiver 400 or 402. Tunable notch filter 430 may also be replaced with a SAW filter in a SiP (system-in-package) design. If multiple LNAs designed for different frequency bands are present in the receiver, then switch matrix 432 may couple an output signal from tunable notch filter 430 to a selected LNA, and switch matrix 442 may couple an amplified signal from the selected LNA to a subsequent circuit (e.g., a downconverter).

FIG. 4A shows an exemplary design of tunable multi-band receiver 400 with one antenna tuning network, one tunable notch filter, and one LNA. FIG. 4B shows an exemplary design of tunable multi-band receiver 402 with one antenna tuning network, one tunable notch filter, and multiple LNAs. In another exemplary design, a tunable multi-band receiver may include an antenna tuning network, followed by a switch matrix, followed by multiple tunable notch filters, followed by multiple LNAs, and followed by another switch matrix. Each LNA may have its input coupled to an output of an associated tunable notch filter. Each pair of tunable notch filter and LNA may cover one or more frequency bands. The switch matrix may select an appropriate pair of tunable notch filter and LNA based on a frequency band of operation.

In general, a tunable multi-band receiver may include any number of antenna tuning networks, any number of tunable notch filters, and any number of LNAs. These circuits may be arranged in any configuration. In an exemplary design, the antenna tuning network(s), tunable notch filter(s), and LNA(s) may be implemented on a fully integrated active receive diversity front-end module. This exemplary design may reduce RF interconnect at the board level and may also reduce the effect of interconnect losses from the antenna due to the integration of the LNA(s).

A tunable multi-band receiver may also be implemented in other manners. For example, tunable notch filter 430 may be combined with antenna tuning network 420. As another example, tunable notch filter 430 may be located before or after LNA(s) 440. A tunable multi-band receiver may also include different and/or additional circuits not shown in FIG. 4A or 4B. For example, an impedance matching circuit may be coupled between tunable notch filter 430 and LNA 440 in FIG. 4A or between tunable notch filter 430 and switch matrix 432 in FIG. 4B.

The circuits in FIG. 4A or 4B may be implemented in various manners. Some exemplary designs of antenna tuning network 420 and tunable notch filter 430 are described below.

Figure 5:
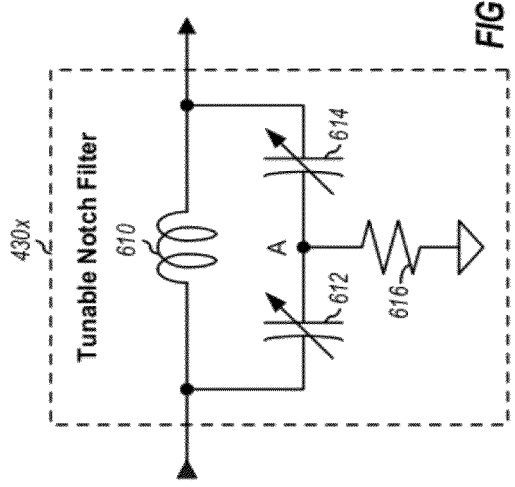
FIG. 5 shows an exemplary design of an antenna tuning network.

FIG. 5 shows a schematic diagram of an antenna tuning network 420x, which is an exemplary design of antenna tuning network 420 in FIGS. 4A and 4B. Antenna tuning network 420x implements a π-topology and includes an inductor 510 and variable capacitors 512 and 514. Inductor 510 is coupled between an input and an output of antenna tuning network

420x. Capacitor 512 is coupled between the input of antenna tuning network 420x and circuit ground. Capacitor 514 is coupled between the output of antenna tuning network 420x and circuit ground. Capacitor 512 and/or 514 may be varied to obtain the desired tuning for an antenna to which antenna tuning network 420x is coupled.

FIG. 5 shows an exemplary design of antenna tuning network 420x with a π-topology. An antenna tuning network may also be implemented in other manners. For example, in one exemplary design, one of capacitors 512 and 514 may be a fixed capacitor, and the other one of capacitors 512 and 514 may be a variable capacitor. In another exemplary design, a fixed capacitor and/or a variable capacitor may be coupled in parallel with inductor 510. In yet another exemplary design, multiple π-networks may be coupled in series, and each π-network may be implemented as shown in FIG. 5. In other exemplary designs, an antenna tuning network may be implemented with any of the exemplary designs described below for a tunable notch filter.

Figure 6A:
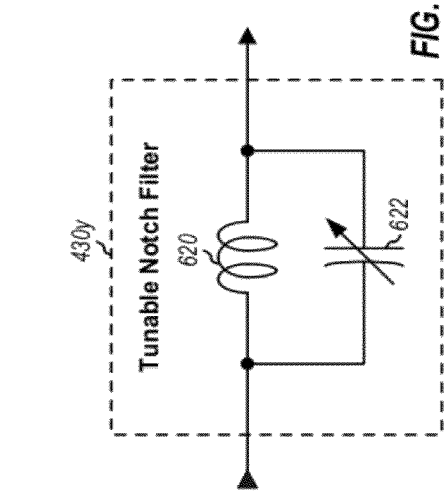
FIGS. 6A to 6D show four exemplary designs of a tunable notch filter.

FIG. 6A shows a schematic diagram of a tunable notch filter 430x, which is an exemplary design of tunable notch filter 430 in FIGS. 4A and 4B. Tunable notch filter 430x implements a bridge-T topology and includes an inductor 610, variable capacitors 612 and 614, and a resistor 616. Inductor 610 is coupled between an input and an output of tunable notch filter 430x. Capacitor 612 is coupled between the input of tunable notch filter 430x and node A. Capacitor 614 is coupled between node A and the output of tunable notch filter 430x. Resistor 616 is coupled between node A and circuit ground. Tunable notch filter 430x may be similar to a shunt coil topology and may provide high Q with resistor tuning. Tunable notch filter 430x may have more insertion loss in the receive band as compared to a simple notch circuit but may have a deeper notch in the transmit band with tuning.

Figure 7A:
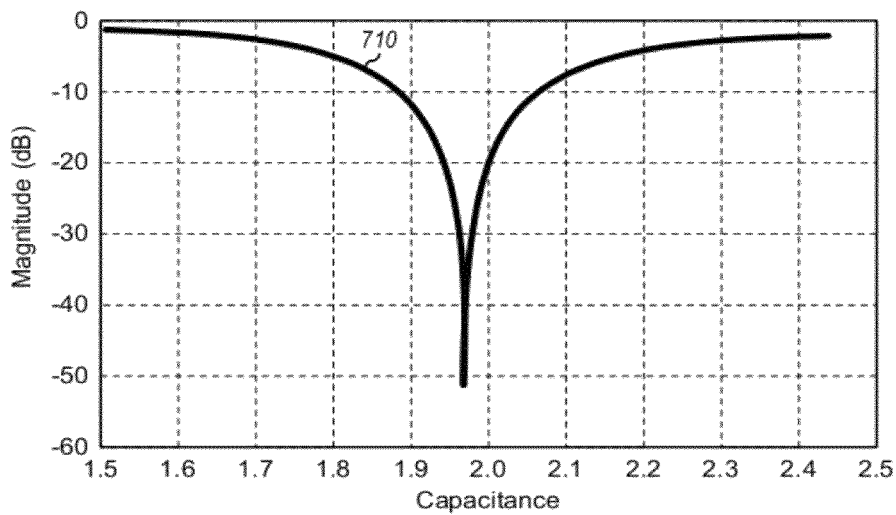
FIGS. 7A and 7B show plots of the performance of the tunable notch filters in FIGS. 6A and 6B, respectively.

FIG. 7A shows plots of the performance of tunable notch filter 430x in FIG. 6A. In FIG. 7A, the horizontal axis denotes the capacitance of variable capacitors 612 and 614, and the vertical axis denotes amplitude/attenuation in units of decibel (dB). A plot 710 shows attenuation in the transmit band. As shown in FIG. 7A, an attenuation of more than 50 dB in the transmit band may be obtained with tunable notch filter 430x.

Figure 6C:
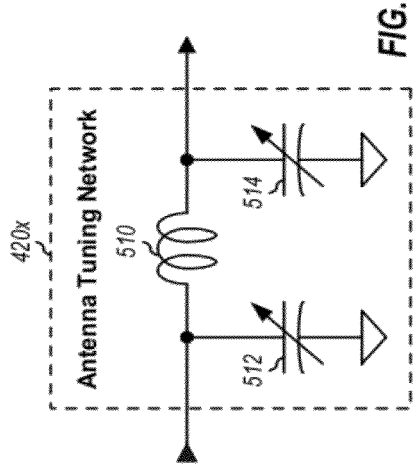
Figure 6B:
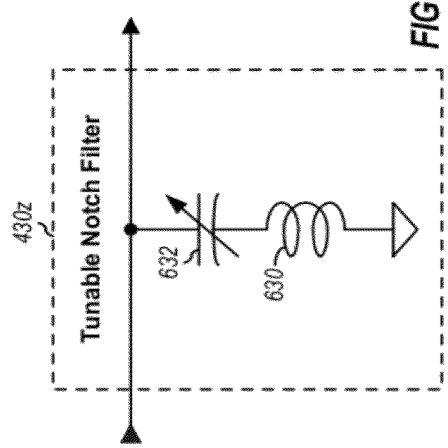

FIG. 6B shows a schematic diagram of a tunable notch filter 430y, which is another exemplary design of tunable notch filter 430 in FIGS. 4A and 4B. Tunable notch filter 430y implements a series LC topology and includes an inductor 620 coupled in parallel with a variable capacitor 622. Inductor 620 and capacitor 622 have one end coupled to the input of tunable notch filter 430y and the other end coupled to the output of tunable notch filter 430y. For the series LC topology, inductor 620 may have a relatively small value, which may be 1.5 to 2 nano-Henries (nH) at 2 GHz for a low insertion loss. Capacitor 622 may have a relatively large value, which may be 4 to 6 pico-Farads (pF) at 2 GHz. The Q of capacitor 622 may have a large impact on the performance of tunable notch filter 430y.

Figure 7B:
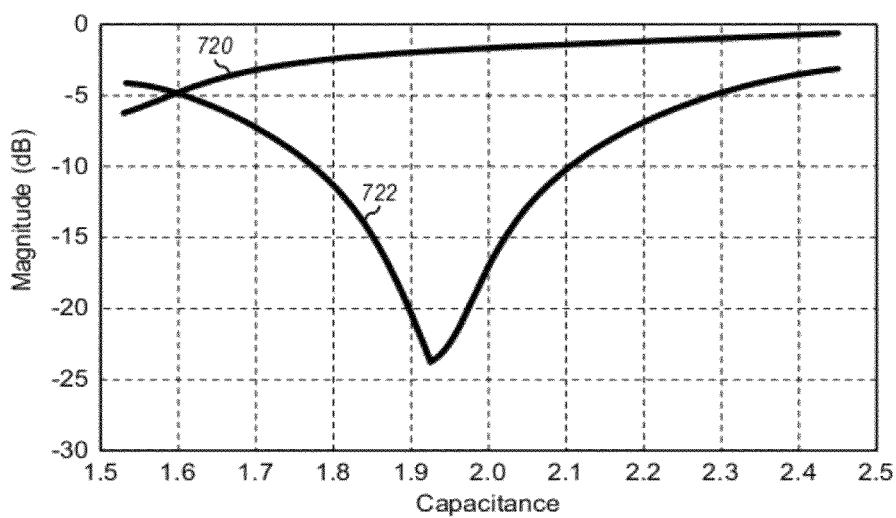

FIG. 7B shows plots of the performance of tunable notch filter 430y in FIG. 6B. In FIG. 7B, the horizontal axis denotes the capacitance of variable capacitor 622, and the vertical axis denotes amplitude/attenuation in units of dB. A plot 720 shows insertion loss of tunable notch filter 430y in the receive band. A plot 722 shows attenuation in the transmit band. As shown in FIG. 7B, an insertion loss of less than a few dB in the receive band and an attenuation of about 23 dB in the transmit band may be obtained with tunable notch filter 430y.

FIG. 6C shows a schematic diagram of a tunable notch filter 430z, which is yet another exemplary design of tunable notch filter 430 in FIGS. 4A and 4B. Tunable notch filter 430z implements a shunt LC topology and includes an inductor 630 coupled in series with a variable capacitor 632. Inductor 630 has one end coupled to circuit ground and the other end coupled to one end of capacitor 632. The other end of capacitor 632 is coupled to the input and output of tunable notch filter 430z. For the shunt LC topology, inductor 630 may have a relatively large value, which may be 12 to 15 nH at 2 GHz, for a low insertion loss. Capacitor 632 may have a relatively small value.

Figure 6D:
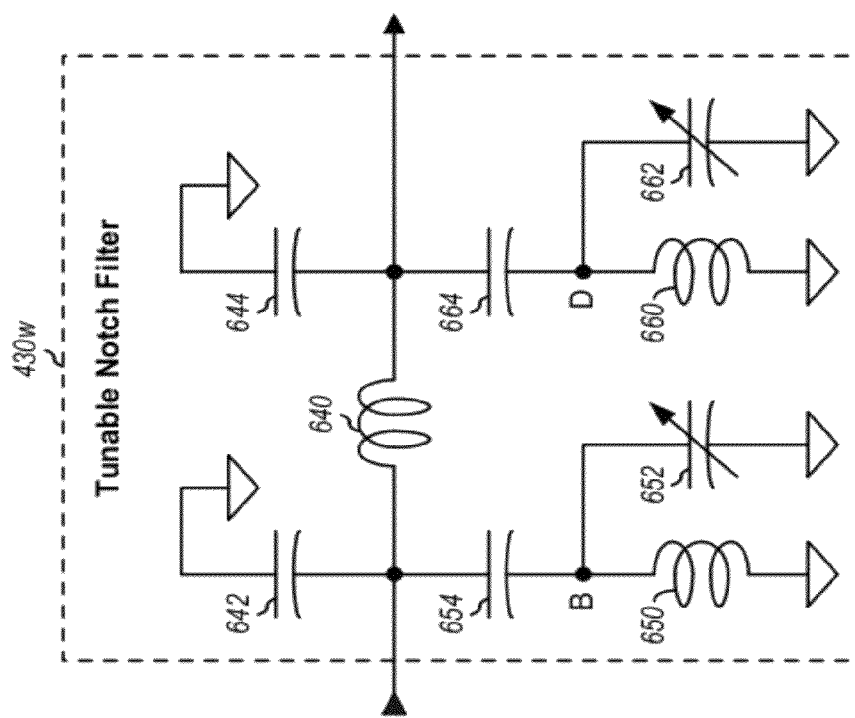

FIG. 6D shows a schematic diagram of a tunable notch filter 430w, which is yet another exemplary design of tunable notch filter 430 in FIGS. 4A and 4B. Tunable notch filter 430w includes an inductor 640 and capacitors 642 and 644, which are coupled in similar manner as inductor 510 and capacitors 512 and 514 in FIG. 5. An inductor 650 and a variable capacitor 652 are coupled in parallel and between node B and circuit ground. A capacitor 654 is coupled between node B and the input of tunable notch filter 430w. An inductor 660 and a variable capacitor 662 are coupled in parallel and between node D and circuit ground. A capacitor 664 is coupled between node D and the output of tunable notch filter 430w.

FIGS. 6A to 6D show four exemplary designs of a tunable notch filter with different circuit topologies. A tunable notch filter may also be implemented in other manners. In one exemplary design, a tunable notch filter may be implemented with the π-topology, e.g., as shown in FIG. 5. In another exemplary design, a fixed capacitor and/or a variable capacitor may be coupled in parallel with inductor 610 in FIG. 6A. In another exemplary design, one of capacitors 612 and 614 in FIG. 6A may be a fixed capacitor, and the other one of capacitors 612 and 614 may be a variable capacitor.

For clarity, FIGS. 4A and 4B show distinct blocks for antenna tuning network 420, tunable notch filter 430, and LNAs 440. In general, the functions of antenna tuning, notch filtering, and amplification may be implemented with one or more circuits performing these functions.

Figure 8:
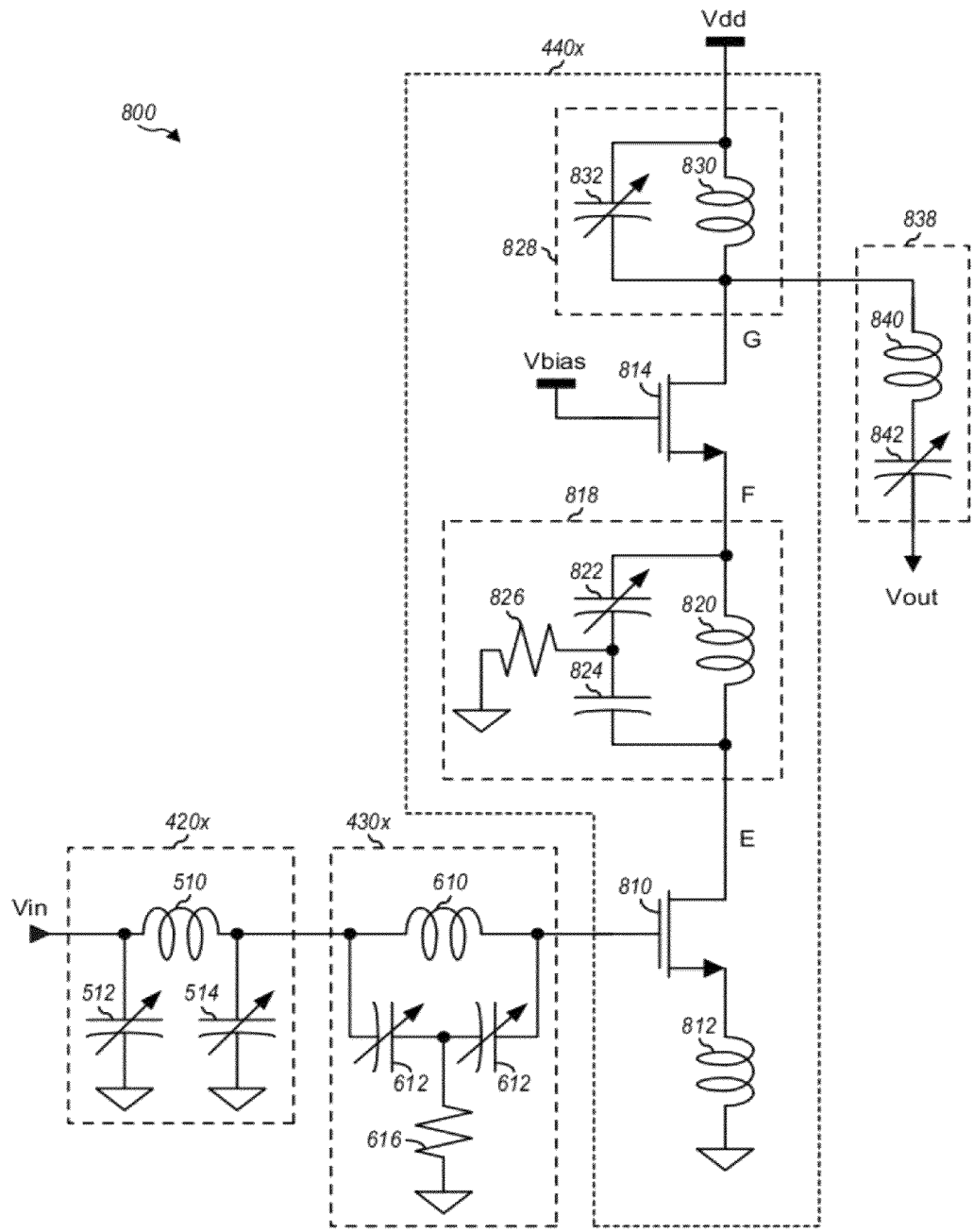
FIG. 8 shows an exemplary design of a tunable multi-band receiver.

FIG. 8 shows a schematic diagram of an exemplary design of a tunable multi-band receiver 800. Receiver 800 includes antenna tuning network 420x, tunable notch filter 430x, and a LNA 440x coupled in series. Antenna tuning network 420x includes inductor 510 and variable capacitors 512 and 514, which are coupled as described above for FIG. 5. Tunable notch filter 430x includes inductor 610, variable capacitors 612 and 614, and resistor 616, which are coupled as described above for FIG. 6A.

Within LNA 440x, an N-channel metal oxide semiconductor (NMOS) transistor 810 has its gate coupled to the output of tunable notch filter 430x, its source coupled to one end of an inductor 812, and its drain coupled to node E. The other end of inductor 812 is coupled to circuit ground. A tunable notch filter 818 implements a bridge-T topology and is coupled between node E and node F. Tunable notch filter 818 includes an inductor 820, a variable capacitor 822, a fixed capacitor 824, and a resistor 826, which are coupled in a similar manner as inductor 610, capacitors 612 and 614, and resistor 616 in FIG. 6A.

An NMOS transistor 814 has its gate receiving a bias voltage (Vbias), its source coupled to node F, and its drain coupled to node G. A tunable notch filter 828 implements a series LC topology and is coupled between node G and a supply voltage (Vdd). Tunable notch filter 828 includes an inductor 830 and a variable capacitor 832, which are coupled in a similar manner as inductor 620 and capacitor 622 in FIG. 6B. A tunable notch filter 838 implements a shunt LC topology and has one end coupled to node G and the other end providing an output signal. Tunable notch filter 838 includes an inductor 840 and a variable capacitor 842, which are coupled in series and between the input and output of tunable notch filter 838.

FIG. 8 shows an exemplary design of LNA 440x implemented with NMOS transistors. A LNA may also be implemented with other types of transistor such as P-channel MOS (PMOS) transistors, bipolar junction transistors (BJTs), etc.

FIG. 8 shows an exemplary design with one antenna tuning network 420x and four tunable notch filters 430x, 818, 828 and 838. In general, a tunable multi-band receiver may include any number of antenna tuning networks and any number of tunable notch filters. More antenna tuning networks and/or more tuning elements may (i) support a wider bandwidth possibly with a higher insertion loss, (ii) enable better tuning of an antenna to cover a wider frequency range and/or provide better selectivity, and (iii) allow for better shaping of the frequency response to provide more far out attenuation. More tunable notch filters may allow for better tuning of a notch over a wider frequency range and/or provide more attenuation at the notch. Each antenna tuning network may be implemented with any circuit topology and may include any number of tunable circuit elements. Similarly, each tunable notch filter may be implemented with any circuit topology and may include any number of tunable circuit elements. One or more antenna tuning networks and one or more tunable notch filters may be coupled in various manners, e.g., directly to one another as shown by antenna tuning network 420x and tunable notch filter 430x in FIG. 8 or indirectly via active circuits such as transistors.

An antenna tuning network may include one or more variable capacitors, e.g., as shown in FIG. 5. A tunable notch filter may also include one or more variable capacitors, e.g., as shown in FIGS. 6A to 6D. A variable capacitor may be implemented in various manners. In one exemplary design, a variable capacitor may be implemented with a continuously variable capacitor (or varactor) having a capacitance that can be varied with an analog control voltage. In another exemplary design, a variable capacitor may be implemented with a digitally variable capacitor having a capacitance that can be varied in discrete units with a digital control signal. In yet another exemplary design, a variable capacitor may be implemented with a micro-electro-mechanical system (MEMS) device.

Figure 9A:
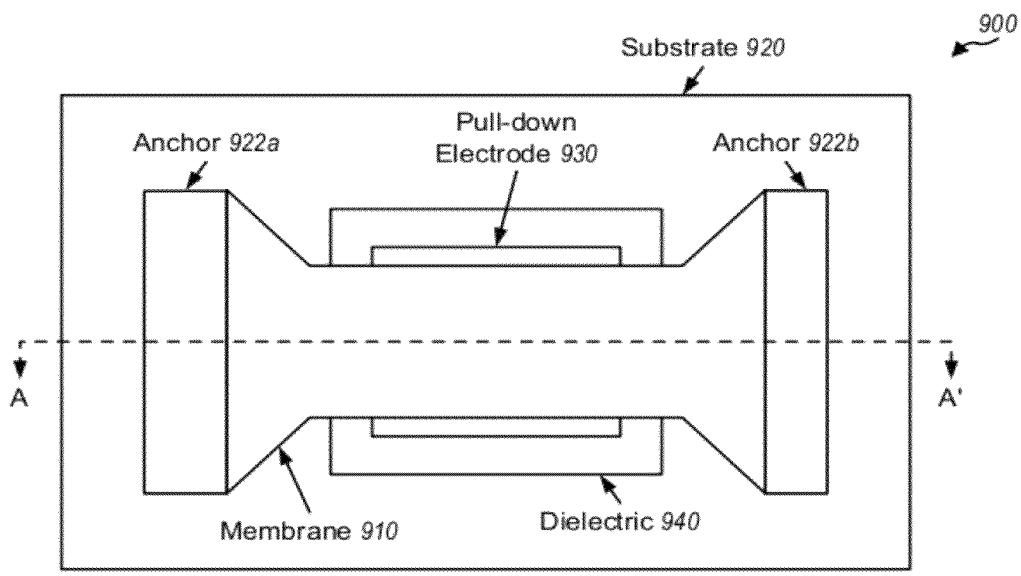
FIGS. 9A and 9B show an exemplary design of a MEMS varactor.
Figure 9B:
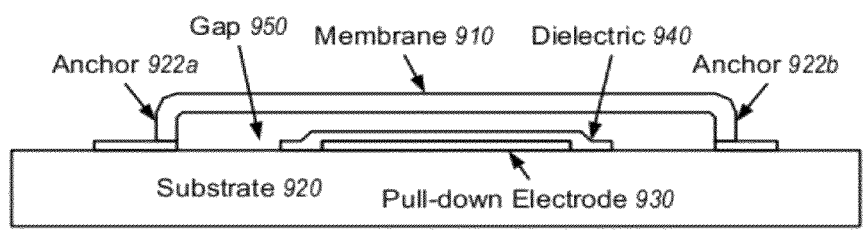

FIG. 9A shows a top view of an exemplary design of a MEMS varactor 900. FIG. 9B shows a cross-sectional view of MEMS varactor 900 in FIG. 9A. The cross-sectional view in FIG. 9B is taken along line A-A' in FIG. 9A. MEMS varactor 900 may be used for any variable capacitor in FIGS. 5 to 6D.

As shown in FIGS. 9A and 9B, MEMS varactor 900 includes a membrane 910 that is attached to a substrate 920 via anchors 922a and 922b located at the two ends of membrane 910. Membrane 910 may be formed with a conductive material (e.g., aluminum) and may also be referred to as a mechanical membrane, a mechanical electrode, a top plate, etc. Substrate 920 may be glass, silicon, or some other material. A pull-down electrode 930 is formed over substrate 920 and under the center of membrane 910. An insulation layer 940 may be formed over electrode 930 with dielectric or some other non-conductive material that can provide electrical insulation. Membrane 910 may be separated from electrode 930 by a gap 950.

MEMS varactor 900 operates as follows. A fixed direct current (DC) voltage may be applied to membrane 910. A variable DC voltage may be applied to electrode 930. The voltage difference between the variable DC voltage applied to electrode 930 and the fixed DC voltage applied to membrane 910 causes membrane 910 to move down. A large voltage difference would cause membrane 910 to move down more, which would then result in a larger capacitance for MEMS varactor 900. The converse would be true for a smaller voltage difference. For example, membrane 910 may be coupled to circuit ground, and a variable DC voltage may be applied to electrode 930. A smallest capacitance of $C_{min}$ may be obtained with zero Volts applied to electrode 930, which would cause membrane 910 to rest at its normal position that is farthest away from electrode 930. A largest capacitance of $C_{max}$ may be obtained with a sufficient voltage applied to electrode 930, which would cause membrane 910 to move toward electrode 930 and rest on insulation layer 940.

FIGS. 9A and 9B show an exemplary design of a MEMS varactor that may be used for an antenna tuning network or a tunable notch filter. A MEMS varactor may also be implemented in other manners.

An antenna tuning network may be tuned in various manners. In an exemplary design, an antenna tuning network may be tuned based on measurements. For example, a received signal strength indicator (RSSI) may be measured for different possible settings of the antenna tuning network. The setting that results in the largest RSSI may be selected. In another exemplary design, an antenna tuning network may be tuned based on a look-up table. The performance of the antenna tuning network may be characterized for different possible settings, e.g., during the design phase, during manufacturing, etc. A look-up table may be defined to store the best setting for the antenna tuning network for each operating scenario, e.g., for each frequency of interest. Thereafter, the look-up table may be accessed to determine the setting to use for a particular operating scenario. An antenna tuning network may also be tuned in other manners.

A tunable notch filter may be tuned in various manners. In an exemplary design, the tunable notch filter may be tuned based on measurements. For example, the leaked TX signal may be measured (e.g., at baseband) for different possible settings of the tunable notch filter. Since the leaked TX signal may be much larger than a desired signal in the scenarios of interest for notch filtering, the total received power of an RX signal may be measured and used as an estimate of the leaked TX signal power. The setting that results in the minimum leaked TX signal may be selected. In another exemplary design, a tunable notch filter may be tuned based on a look-up table. The performance of the tunable notch filter may be characterized for different possible settings, e.g., during the design phase, during manufacturing, etc. A look-up table may be defined to store the best setting for the tunable notch filter for each operating scenario, e.g., for each frequency of interest. Thereafter, the look-up table may be accessed to determine the setting to use for a particular operating scenario. A tunable notch filter may also be tuned in other manners.

A tunable multi-band receiver may operate on a particular frequency band, which may be associated with a transmit band and a receive band. An antenna tuning network in the tunable multi-band receiver may tune an antenna to the receive band. A tunable notch filter may be tuned to the transmit band and may attenuate a leaked TX signal in the transmit band.

In general, a tunable multi-band receiver may be designed to support any number of frequency bands and any particular frequency band. For example, a tunable multi-band receiver may be designed to support one or more of the frequency bands listed in Table 1. Each frequency band may include a transmit band (for data transmission on the uplink) and a receive band (for data reception on the downlink) for a wireless device. For each frequency band, the transmit band may be separated from the receive band by a particular frequency offset, which may be dependent on the frequency band. For example, the transmit band may be 190 MHz lower than the receive band for UMTS Band I.

TABLE 1

| Frequency Band | Transmit Band Uplink (MHz) | Receive Band Downlink (MHz) | Common Name | Frequency Band |
|---|---|---|---|---|
| UMTS Band I | 1920-1980 | 2110-2170 | IMT-2000 | |
| UMTS Band II | 1850-1910 | 1930-1990 | PCS | GSM 1900 |
| UMTS Band III | 1710-1785 | 1805-1880 | DCS | GSM 1800 |
| UMTS Band IV | 1710-1770 | 2110-2170 | | |
| UMTS Band V | 824-849 | 869-894 | Cellular | GSM 850 |
| UMTS Band VI | 830-840 | 875-885 | | |
| UMTS Band VII | 2500-2570 | 2620-2690 | | |
| UMTS Band VIII | 880-915 | 925-960 | | |
| UMTS Band IX | 1750-1785 | 1845-1880 | | |
| UMTS Band X | 1710-1770 | 2110-2170 | | |
| UMTS Band XI | 1428-1453 | 1476-1501 | | |
| UMTS Band XII | 698-716 | 728-746 | | |
| UMTS Band XIII | 777-787 | 746-756 | | |
| UMTS Band XIV | 788-798 | 758-768 | | |
| | 890-915 | 935-960 | | GSM 900 |

In general, a tunable multi-band receiver may be used for a primary antenna, a diversity antenna, or some other antenna. A tunable multi-band receiver may be used for a diversity antenna to reduce or eliminate front-end RF filtering and to reduce circuit area and cost. This may be beneficial since the use of receive diversity has grown, especially with the rapid growth of data usage on smart phones, tablets, etc. This may also be beneficial since a wireless device may be required to support multiple frequency bands for receive diversity.

In an exemplary design, an apparatus (e.g., a wireless device, an IC, etc.) may comprise a tunable multi-band receiver comprising an antenna tuning network, a tunable notch filter, and at least one LNA, e.g., as shown in FIG. 4A or 4B. The antenna tuning network may tune an antenna to a receive band in a plurality of receive bands. The tunable notch filter may be operatively coupled to the antenna tuning network and may attenuate signal components in a transmit band associated with the receive band. The tunable notch filter may be tunable to the transmit band in a plurality of transmit bands, which may be associated with the plurality of receive bands. The at least one LNA may be operatively coupled to the tunable notch filter and may amplify an output signal from the tunable notch filter.

In an exemplary design, the at least one LNA may comprise a single LNA supporting the plurality of receive bands, e.g., as shown in FIG. 4A. This single LNA may be coupled directly to the tunable notch filter. In another exemplary design, the at least one LNA may comprise a plurality of LNAs, with each LNA supporting at least one of the plurality of receive bands, e.g., as shown in FIG. 4B. In this exemplary design, the apparatus may further comprise first and second switch matrices. The first switch matrix may be operatively coupled to the tunable notch filter and the plurality of LNAs and may route the output signal from the tunable notch filter to a selected LNA among the plurality of LNAs. The second switch matrix may be operatively coupled to the plurality of LNAs and may provide an amplified signal from the selected LNA.

In an exemplary design, the antenna tuning network may comprise an inductor coupled to at least one variable capacitor, e.g., as shown in FIG. 5. The inductor may be coupled between an input and an output of the antenna tuning network. Each variable capacitor may be coupled to the input or the output of the antenna tuning network.

In an exemplary design, the tunable notch filter may comprise an inductor and a plurality of capacitors coupled in a bridge-T topology, e.g., as shown in FIG. 6A. The inductor may be coupled between an input and an output of the tunable notch filter. The plurality of capacitors may comprise at least one variable capacitor and may be coupled in series and between the input and the output of the tunable notch filter. In an exemplary design, the plurality of capacitors may comprise two variable capacitors coupled in series, e.g., as shown in FIG. 6A. The tunable notch filter may further comprise a resistor coupled to the two variable capacitors and circuit ground.

In another exemplary design, the tunable notch filter may comprise an inductor and a variable capacitor coupled in a series LC topology, e.g., as shown in FIG. 6B. The inductor may be coupled between the input and output of the tunable notch filter. The variable capacitor may be coupled in parallel with the inductor. In yet another exemplary design, the tunable notch filter may comprise an inductor and a variable capacitor coupled in a shunt LC topology, e.g., as shown in FIG. 6C. The inductor and the variable capacitor may be coupled in series and to the input and output of the tunable notch filter.

In an exemplary design, the apparatus may further comprise a second tunable notch filter operatively coupled to the at least one LNA and to further attenuate the signal components in the transmit band. The tunable notch filter may be implemented with a first circuit topology (e.g., a bridge-T topology or some other circuit topology). The second tunable notch filter may be implemented with a second circuit topology (e.g., a series LC topology, a shunt LC topology, or some other circuit topology), which may be different from the first circuit topology. In an exemplary design, the second tunable notch filter may be part of a LNA, e.g., as shown in FIG. 8. The apparatus may further comprise one or more additional tunable notch filters to further attenuate the signal components in the transmit band, e.g., as shown in FIG. 8.

In an exemplary design, the apparatus may comprise a plurality of antennas, which may include a primary antenna and a diversity antenna, e.g., as shown in FIG. 3. The tunable multi-band receiver may be coupled to the diversity antenna or the primary antenna.

Figure 10:
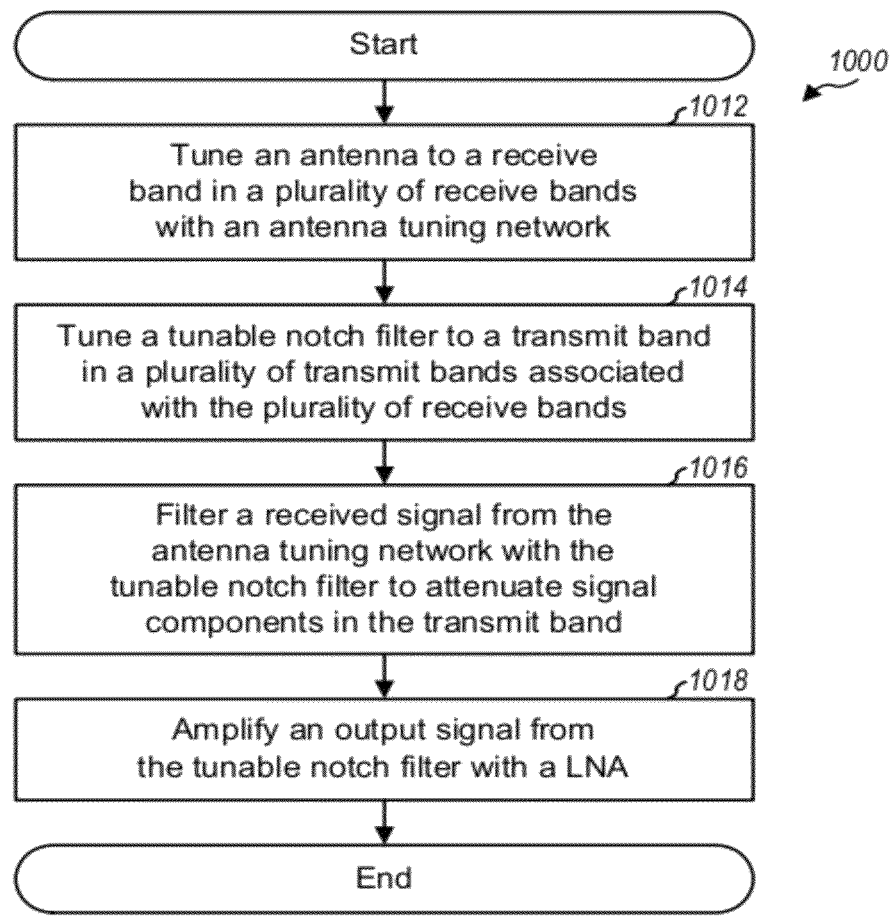
FIG. 10 shows a process for receiving and processing an RX signal.

FIG. 10 shows an exemplary design of a process 1000 for receiving and processing an RX signal by a wireless device. An antenna may be tuned to a receive band in a plurality of receive bands with an antenna tuning network (block 1012). A tunable notch filter may be tuned to a transmit band in a plurality of transmit bands associated with the plurality of receive bands (block 1014). A received signal from the antenna tuning network may be filtered with the tunable notch filter to attenuate signal components in the transmit band (block 1016). An output signal from the tunable notch filter may be amplified with a LNA (block 1018).

In an exemplary design, the LNA may support the plurality of receive bands and may be coupled directly to the tunable notch filter, e.g., as shown in FIG. 4A. In another exemplary design, the LNA may be one of a plurality of LNAs supporting the plurality of receive bands, e.g., as shown in FIG. 4B. In this exemplary design, the output signal from the tunable notch filter may be routed to the LNA via a first switch matrix, and an amplified signal from the LNA may be provided via a second switch matrix, e.g., as shown in FIG. 4B.

In an exemplary design, the signal components in the transmit band may be further attenuated with one or more additional tunable notch filters. The tunable notch filter and the additional tunable notch filter(s) may be implemented in various manners (e.g., as shown in FIGS. 6A to 6D) and may also be coupled in various manners (e.g., as shown in FIGS. 4A, 4B and 8).

A tunable multi-band receiver described herein may be implemented on an IC, an analog IC, an RFIC, a mixed-signal IC, an ASIC, a printed circuit board (PCB), an electronic device, etc. A tunable multi-band receiver may also be fabricated with various IC process technologies such as complementary metal oxide semiconductor (CMOS), NMOS, PMOS, BJT, bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing a tunable multi-band receiver described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an antenna tuning network configured to tune in a single receive path an antenna to a receive band from among a plurality of receive bands capable of being tuned to in the single receive path by the antenna tuning network;
   a tunable notch filter operatively coupled to the antenna tuning network and configured to attenuate in the single receive path signal components in a transmit band; and
   a plurality of low noise amplifiers (LNAs), each LNA of the plurality of LNAs configured for selectively coupling to the tunable notch filter and configured to amplify in the single receive path an output signal from the tunable notch filter.

2. The apparatus of claim 1, at least one LNA of the plurality of LNAs comprising a first LNA for a high frequency band above a predetermined frequency and a second LNA of the plurality of LNAs for a low frequency band below the predetermined frequency.

3. The apparatus of claim 1, each LNA of the plurality of LNAs supporting at least one of the plurality of receive bands.

4. The apparatus of claim 3, further comprising:
   a first switch matrix operatively coupled to the tunable notch filter and the plurality of LNAs and configured to route the output signal from the tunable notch filter to a selected LNA among the plurality of LNAs; and
   a second switch matrix operatively coupled to the plurality of LNAs and configured to provide an amplified signal from the selected LNA.

5. The apparatus of claim 1, the tunable notch filter being tunable to one of a plurality of transmit bands associated with the plurality of receive bands.

6. The apparatus of claim 1, the antenna tuning network comprising:
   an inductor coupled between an input and an output of the antenna tuning network, and
   at least one variable capacitor coupled to the inductor, each variable capacitor being coupled to the input or the output of the antenna tuning network.

7. The apparatus of claim 1, the tunable notch filter comprising:
   an inductor coupled between an input and an output of the tunable notch filter, and
   a plurality of capacitors coupled in series and between the input and the output of the tunable notch filter, the plurality of capacitors comprising at least one variable capacitor.

8. The apparatus of claim 7, the plurality of capacitors comprising two variable capacitors coupled in series, the tunable notch filter further comprising:
   a resistor coupled to the two variable capacitors and circuit ground.

9. The apparatus of claim 1, the tunable notch filter comprising:
   an inductor coupled to an input and an output of the tunable notch filter, and
   a variable capacitor coupled in parallel with the inductor.

10. The apparatus of claim 1, the tunable notch filter comprising:
    an inductor and a variable capacitor coupled in series and to an input and an output of the tunable notch filter.

11. The apparatus of claim 1, further comprising:
    a second tunable notch filter operatively coupled to the at least one LNA and configured to further attenuate the signal components in the transmit band.

12. The apparatus of claim 11, wherein the tunable notch filter is implemented with a first circuit topology, and wherein the second tunable notch filter is implemented with a second circuit topology different from the first circuit topology.

13. The apparatus of claim 11, wherein the second tunable notch filter is part of a LNA among the at least one LNA.

14. The apparatus of claim 11, further comprising:
at least one additional tunable notch filter configured to further attenuate the signal components in the transmit band.

15. The apparatus of claim 1, further comprising:
a plurality of antennas including a primary antenna and a diversity antenna, the antenna corresponding to the diversity antenna.

16. The apparatus of claim 1, the apparatus comprising an integrated circuit.

17. A method comprising:
tuning in a single receive path an antenna to a receive band from among a plurality of receive bands capable of being tuned to in the single receive path by an antenna tuning network;
filtering in the single receive path a received signal from the antenna tuning network with a tunable notch filter to attenuate signal components in a transmit band; and
amplifying in the single receive path an output signal from the tunable notch filter with a low noise amplifier (LNA) of a plurality of switchably selectable LNAs.

18. The method of claim 17, further comprising:
tuning the tunable notch filter to the transmit band in a plurality of transmit bands associated with the plurality of receive bands.

19. The method of claim 17, the at least one LNA comprising a plurality of LNAs, the method further comprising:
routing the output signal from the tunable notch filter to a selected LNA among the plurality of LNAs via a first switch matrix, and
providing an amplified signal from the selected LNA via a second switch matrix.

20. The method of claim 17, further comprising:
attenuating the signal components in the transmit band with at least one additional tunable notch filter.

21. An apparatus comprising:
means for tuning in a single receive path an antenna to a receive band from among a plurality of receive bands capable of being tuned to in the single receive path by the means for tuning;
means for filtering in the single receive path a received signal from the means for tuning the antenna to attenuate signal components in a transmit band; and
means for amplifying in one of a plurality of switchably selectable amplification paths an output signal from the means for filtering.

22. The apparatus of claim 21, further comprising:
means for tuning the means for filtering to the transmit band in a plurality of transmit bands associated with the plurality of receive bands.

23. The apparatus of claim 21, further comprising:
means for routing the output signal from the tunable notch filter to the means for amplifying among a plurality of means for amplifying.

24. The apparatus of claim 21, further comprising:
means for further attenuating the signal components in the transmit band.

* * * * *